United States Patent
Zhang et al.

(10) Patent No.: US 6,833,572 B2
(45) Date of Patent: Dec. 21, 2004

(54) ELECTRODE MATERIALS WITH IMPROVED HYDROGEN DEGRADATION RESISTANCE

(75) Inventors: Fengyan Zhang, Vancouver, WA (US); Tingkai Li, Vancouver, WA (US); Hong Ying, San Jose, CA (US); Yoshi Ono, Camas, WA (US); Sheng Teng Hsu, Camas, WA (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/229,603

(22) Filed: Aug. 27, 2002

(65) Prior Publication Data

US 2003/0007319 A1 Jan. 9, 2003

Related U.S. Application Data

(62) Division of application No. 09/817,712, filed on Mar. 26, 2001, now Pat. No. 6,440,752.

(51) Int. Cl.[7] .......................... H01L 29/76; H01L 29/94; H01L 31/062; H01L 31/113; H01L 31/119
(52) U.S. Cl. ................. 257/295; 257/296; 257/303
(58) Field of Search ................ 257/295, 296, 257/303, 306, 310; 438/3, 240, 253, 396

(56) References Cited

U.S. PATENT DOCUMENTS 6,020,233 A * 2/2000 Kim ........................ 438/240

* cited by examiner

*Primary Examiner*—Hoai Pham
(74) *Attorney, Agent, or Firm*—David C. Ripma; Matthew D. Rabdau; Joseph P. Curtin

(57) ABSTRACT

An electrode for use in a ferroelectric device includes a bottom electrode; a ferroelectric layer; and a top electrode formed on the ferroelectric layer and formed of a combination of metals, including a first metal take from the group of metals consisting of platinum and iridium, and a second metal taken from the group of metals consisting of aluminum and titanium; wherein the top electrode acts as a passivation layer and wherein the top electrode remains conductive following high temperature annealing in a hydrogen atmosphere. A method of forming a hydrogen-resistant electrode in a ferroelectric device includes forming a bottom electrode; forming a ferroelectric layer on the bottom electrode; depositing a top electrode on the ferroelectric layer; including depositing, simultaneously, a first metal taken from the group of metals consisting of platinum and iridium; and a second metal taken from the group of metals consisting of aluminum and titanium; and forming a passivation layer by annealing the structure in an oxygen atmosphere to form an oxide passivation layer on the top electrode.

8 Claims, 3 Drawing Sheets

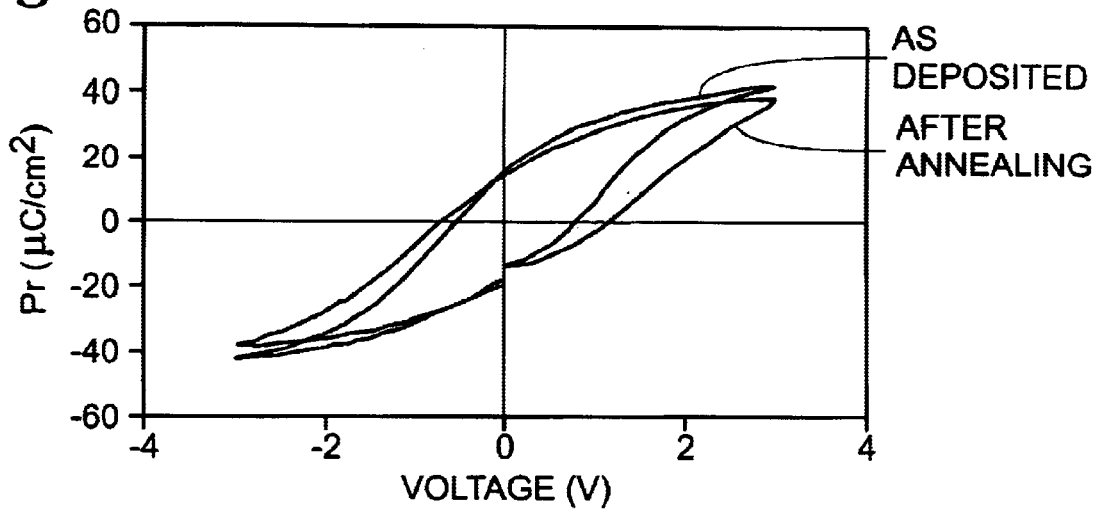
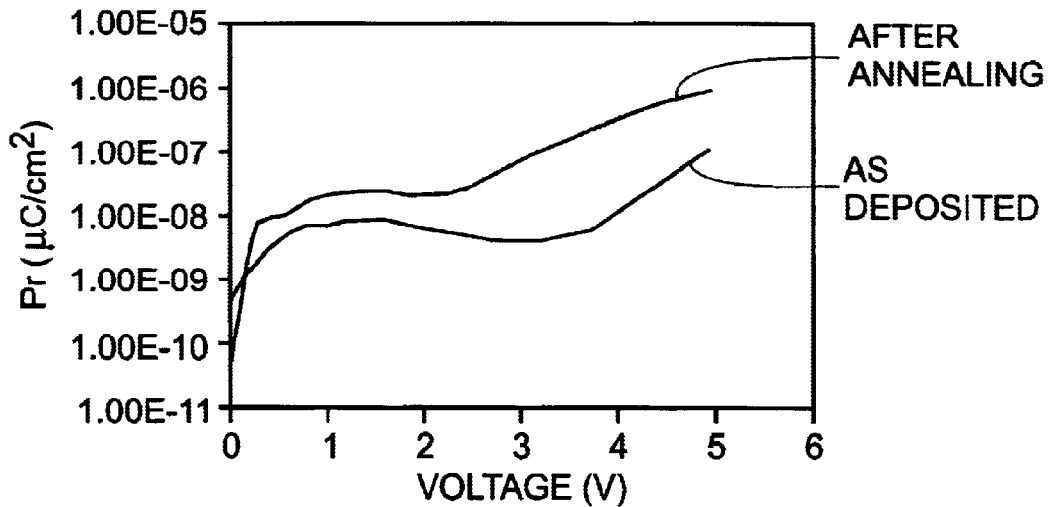

ELECTRODE MATERIALS WITH IMPROVED HYDROGEN DEGRADATION RESISTANCE

CROSS REFERENCE TO RELATED APPLICATIONS

This application is a divisional of application Ser. No. 09/817,712, filed Mar. 26, 2001, entitled "Electrode Materials With Improved Hydrogen Degradation Resistance and Fabrication Method," invented by Fengyan Zhang et al., now U.S. Letters Pat. No. 6,440,752.

FIELD OF THE INVENTION

This invention relates to materials for electrodes in ICs, and specifically to electrode materials having improved hydrogen degradation resistance properties.

BACKGROUND OF THE INVENTION

Platinum (Pt) has been widely used for top and bottom electrodes in ferroelectric-based capacitors and devices. High temperature hydrogen annealing may be performed to test the integrity and properties of the ferroelectric stack. The major drawback when using Pt as a top electrode is its catalytic nature in the presence of hydrogen. It has been found that the integrity of a Pt top electrode may be severely damaged during 400° C. forming gas annealing in just 30 sec. Fujisaki et al., *Degradation-free ferroelectric (Pb(Zr, Ti)O$_3$ thin film capacitors with IrO$_2$ top electrode*, Integrated Ferroelectrics, Vol. 21, pp. 83–85 (1998). Furthermore, Pt accelerates the decomposition of H$_2$ molecules into atomic hydrogen which will attack and deoxidize the oxide based ferroelectric material, thus degrading their ferroelectric properties.

Titanium oxide (TiO$_2$) has been shown to have passivation properties during hydrogen ambient annealing. A very thin layer of Al$_2$O$_3$ is also effective to protect ferroelectric capacitors, however, use of either TiO$_2$ or Al$_2$O$_3$ requires an additional deposition step, preferably by CVD, to achieve good step coverage.

SUMMARY OF THE INVENTION

An electrode for use in a ferroelectric device includes a bottom electrode; a ferroelectric layer; and a top electrode formed on the ferroelectric layer and formed of a combination of metals, including a first metal take from the group of metals consisting of platinum and iridium, and a second metal taken from the group of metals consisting of aluminum and titanium; wherein the top electrode acts as a passivation layer.

A method of forming a hydrogen-resistant electrode in a ferroelectric device includes forming a bottom electrode; forming a ferroelectric layer on the bottom electrode; depositing a top electrode on the ferroelectric layer; including depositing, simultaneously, a first metal taken from the group of metals consisting of platinum and iridium; and a second metal taken from the group of metals consisting of aluminum and titanium; and forming a passivation layer by annealing the structure in an oxygen atmosphere to form an oxide passivation layer on the top electrode.

An object of the invention is to provide an electrode material which may be used in nonvolatile memory devices, DRAMs, capacitors, pyroelectric infrared sensors, optical displays, optical switches, piezoelectric transducers, and surface acoustic wave devices.

A further object of the invention is to provide an electrode material that has improved hydrogen degradation resistance.

Another object of the invention is to provide an electrode material which can maintain integrity and the ferroelectric properties can retained when the ferroelectric capacitor or devices experience a typical hydrogen ambient annealing, at temperatures in a range of about 300° C. to 500° C.

This summary and objectives of the invention are provided to enable quick comprehension of the nature of the invention. A more thorough understanding of the invention may be obtained by reference to the following detailed description of the preferred embodiment of the invention in connection with the drawings.

BRIEF DESCRIPTION OF THE DRAWINGS

FIG. 7 depicts the hysteresis loop of a Pt—Al—O/PZT/Pt/Ir capacitor.

FIG. 8 depicts the leakage current of the Pt—Al—O/PZT/Pt/Ir capacitor of FIG. 7 before and after forming gas annealing.

DETAILED DESCRIPTION OF THE PREFERRED EMBODIMENTS

The materials described herein may be used as bottom and top electrodes, and are particularly suited for use as top electrodes, to prevent the degradation of ferroelectric properties of ferroelectric-based capacitors and nonvolatile memories during hydrogen ambient annealing in the fabrication process. These materials may also be used in the fabrication of DRAMs, sensors, displays and transducers. The electrode material of the invention includes a noble, or inert metal, such as Pt or Ir, which is deposited simultaneously with another high-conductivity metal, such as Al or Ti. The electrode material may be deposited by cosputtering or by physical vapor deposition (PVD) Pt or Ir and Al or Ti in an oxygen ambient atmosphere prior to annealing in a hydrogen atmosphere.

Post deposition annealing is usually required in order to make the top electrode effectively resistant to hydrogen ambient annealing. Under analysis by SEM, charging was found on the surface of an Ir—Al—O electrode after this film was annealed in oxygen ambient, indicating that a thin layer of insulating material was formed on the surface. This insulating layer is probably an Al$_2$O$_3$ layer, or layer rich in Al$_2$O$_3$. This in situ formed Al$_2$O$_3$ layer acts as a passivation layer to protect the electrode and the ferroelectric material underneath during hydrogen ambient annealing. Four point probe testing establishes indicate that the Ir—Al—O film is still conductive after this oxygen ambient annealing.

For example, an Ir—Al—O layer may be deposited by DC cosputtering Ir and Al targets at between about 50W to 500W on each target, in an $O_2$ ambient atmosphere with an Ar and $O_2$ flow ratio of between about 1:10 to 10:1 and a chamber pressure of between about 2 mTorr. to 100 mTorr. The post deposition annealing is performed in $O_2$ ambient at between about 400° C. to 700° C. for between ten seconds and one hour. A Pt—Al—O layer may be deposited and annealed under similar conditions. As used herein, high-temperature annealing means annealing at a temperature at or above 400° C.

Figure 1:
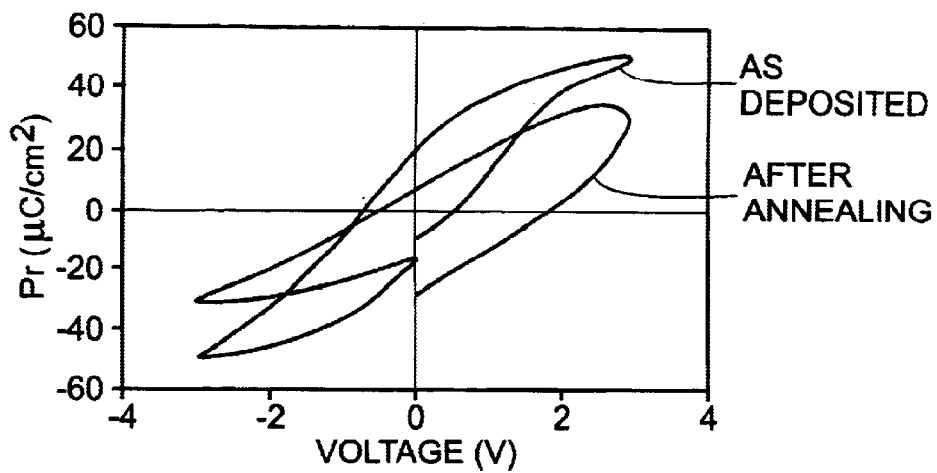
FIG. 1 depicts the hysteresis loop of an Ir—Al—O/PZT/Pt/Ir capacitor covered by TiO$_2$ before and after forming gas annealing.
Figure 2:
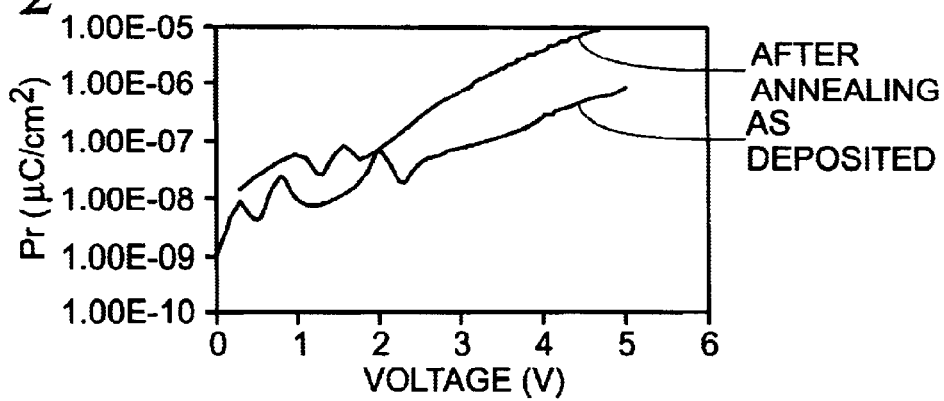
FIG. 2 depicts the leakage current of the Ir—Al—O/PZT/Pt/Ir capacitor of FIG. 1 covered by TiO$_2$ before and after forming gas annealing.
Figure 3:
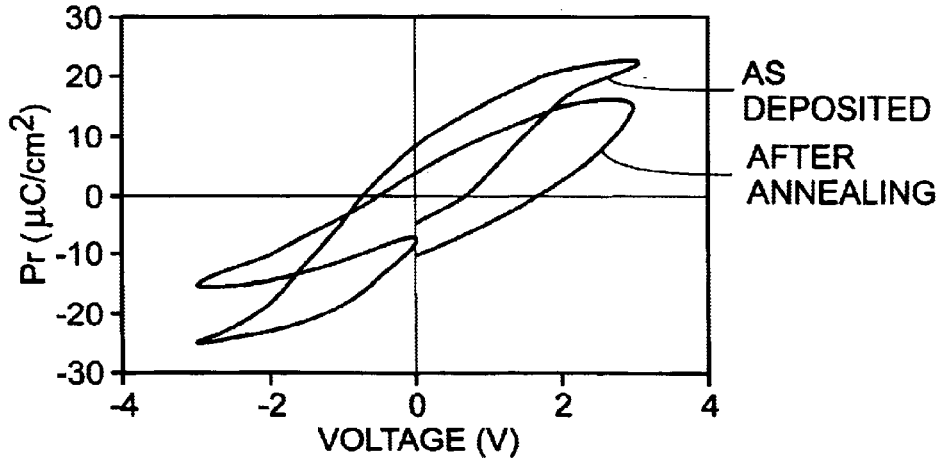
FIG. 3 depicts the hysteresis loop of a Pt/PZT/Pt/Ir capacitor covered by TiO$_2$ before and after forming gas annealing at 400° C. for 10 minutes.
Figure 4:
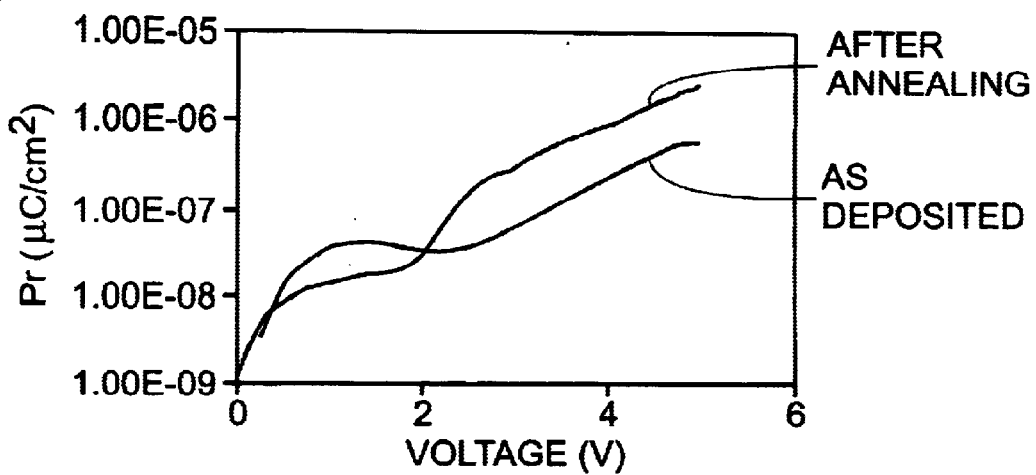
FIG. 4 depicts the leakage current of the Pt/PZT/Pt/Ir capacitor of FIG. 3 covered by TiO$_2$ before and after forming gas annealing at 400° C. for 10 minutes.
Figure 5:
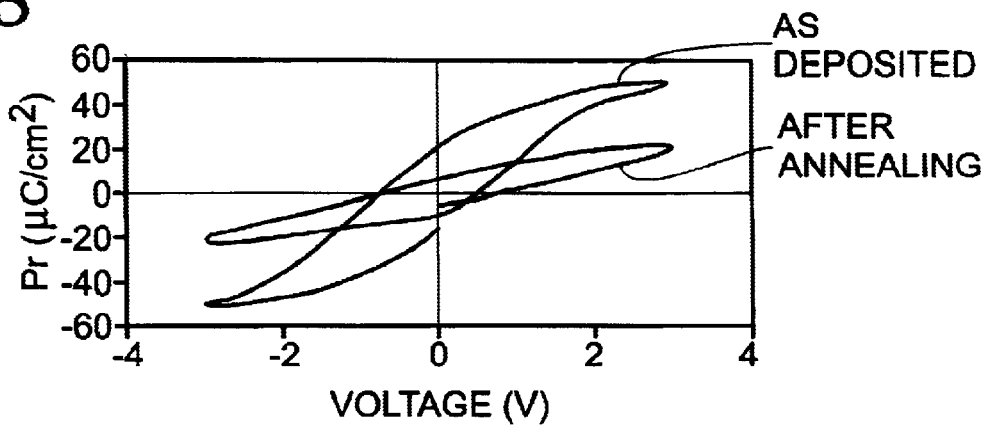
FIG. 5 depicts the hysteresis loop of an Ir—Al—O/PZT/Pt/Ir capacitor before and after forming gas annealing at 400° C.
Figure 6:
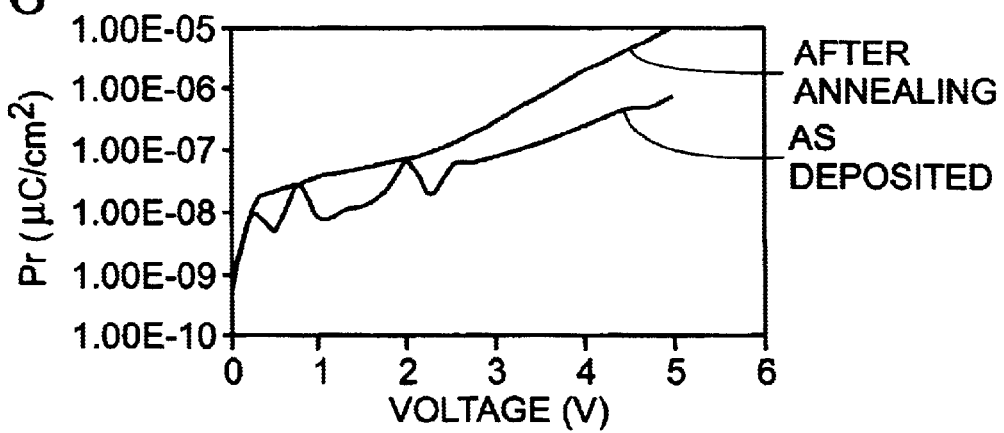
FIG. 6 depicts the leakage current of the Ir—Al—O/PZT/Pt/Ir capacitor of FIG. 5 before and after forming gas annealing at 400° C.

Test results were gathered following the formation of three different electrode compositions: Pt, as shown in FIGS. 3 and 4, Ir—Al—O, as shown in FIGS. 1, 2, 5 and 6, and Pt—Al—O, as shown in FIGS. 7 and 8, were deposited on Pb(Zr, Ti)$O_3$ ferroelectric oxide (PZT) as a top electrode. Some of the Pt and Ir—Al—O electrodes were covered by $TiO_2$, which was deposited by sputtering, FIGS. 3 and 4 and 1 and 2, respectively, while the others were not, FIGS. 5 and 6. Fabrication of the structure included formation of a bottom electrode, formed by deposition of Pt or Ir, forming a ferroelectric layer on the bottom electrode, and forming the top electrode according to the invention. The structures having the Al or Ti metal as part of the top electrode were initially annealed in an $O_2$ atmosphere. The hydrogen damage resistance was tested by annealing the entire structure were annealed in forming gas with 5% of $H_2$ at 400° C. Such testing may take place in an atmosphere of between about 3% to 15% hydrogen, with the remaining percentage being nitrogen, at temperatures between about 300° C. to 500° C.

The bare Pt top electrode peeled severely after forming gas annealing at 400° C. for only 30 seconds. The Pt electrode covered with $TiO_2$, FIGS. 3 and 4, maintained good integrity after an accumulated time of 16 min annealing. The Ir—Al—O electrodes maintained good integrity after annealing regardless of the presence of a $TiO_2$ layer, FIGS. 1, 2, 5 and 6. Likewise, the Pt—Al—O electrode also maintained good integrity after an accumulated annealing time of 15 min regardless of the presence of a $TiO_2$ layer, FIGS. 7 and 8.

Electrodes formed of Pt/PZT/Pt/Ir and Ir—Al—O/PZT/Pt/Ir and covered with a layer of $TiO_2$ maintained about ⅔ of their original remnant polarization after forming gas annealing, however, those structures developed increased leakage current during forming gas annealing, which leakage increased with increased annealing time, as shown on FIGS. 1–4. The bare Ir—Al—O/PZT/Pt/Ir structure, FIGS. 5 and 6, did not develop as much leakage as the $TiO_2$ covered structure. About half of the polarization remained after accumulated 16 min forming gas annealing. The best result was obtained from the Pt—Al—O/PZT/Pt/Ir structure without any $TiO_2$ protection, FIGS. 7 and 8, wherein the remnant polarization remained about the same even after 16 min accumulated forming gas annealing.

To summarize, a ferroelectric device may be formed using any of several electrode materials, such as Ir—Al—O, Ir—Ti—O, Pt—Al—O, Pt—Ti—O, deposited by PVD, CVD or MOCVD. The as-deposited Ir—Al—O, Ir—Ti—O, Pt—Al—O, Pt—Ti—O films are annealed in oxygen at 400° C. to 700° C. for ten seconds to one hour, to obtain a thin insulating layer of $Al_2O_3$, a layer rich in $Al_2O_3$, a $TiO_2$ layer or a layer rich in $TiO_2$, on the surface of the composite electrode to act as an passivation layer.

Thus, a method for depositing electrode materials with improved hydrogen degradation resistance and a fabrication method therefor has been disclosed. It will be appreciated that further variations and modifications thereof may be made within the scope of the invention as defined in the appended claims.

What is claimed is:

1. An electrode for use in a ferroelectric device, comprising:
   a bottom electrode;
   a ferroelectric layer; and
   a top electrode formed on the ferroelectric layer and formed of a combination of iridium, metals, including a first metal taken from the group of metals consisting of platinum and iridium and a second metal taken from the group of metals consisting of aluminum and titanium; wherein said top electrode has a metal oxide layer formed thereon, and wherein said metal oxide layer is a metal oxide formed from the metals of the top electrode, which metal oxide layer acts as a passivation layer.

2. The electrode of claim 1 wherein said passivation layer includes metal oxides taken from the group of metal oxides consisting of Ir—Al—O, Ir—Ti—O, Pt—Al—O and Pt—Ti—O.

3. The electrode claim 2 wherein the metal oxides are taken from the group of oxides consisting of $Al_2O_3$ and $TiO_2$.

4. The electrode of claim 1 wherein said top electrode remains conductive following high temperature annealing in a hydrogen atmosphere.

5. An electrode for use in a ferroelectric device, comprising:
   a bottom electrode;
   a ferroelectric layer; and
   a top electrode formed on the ferroelectric layer wherein said top electrode includes a combination of metals taken from the group of metals consisting of PtAl, PtTi, IrAl and IrTi, and a passivation layer of metal oxides formed of said metals on said top electrode, wherein said metal oxides are taken from the group of metal oxides consisting of Ir—Al—O, Ir—Ti—O, Pt—Al—O and Pt—Ir—O, wherein said top electrode remains conductive following high temperature annealing in a, hydrogen atmosphere.

6. The electrode of claim 5 wherein the metal oxides are taken from the group of metal oxides consisting $Al_2O_3$ and $TiO_2$.

7. An electrode for us in a ferroelectric device, comprising:
   a bottom electrode;
   a ferroelectric layer; and
   a top electrode formed on the ferroelectric layer and formed of a combination of metals, wherein said top electrode includes a combination of metals taken from the group of metals consisting of PtAl, PtTi, IrAl and IrTi, and a passivation layer of metal oxides formed of said metals on said top electrode, wherein said metal oxides are taken from the group of metal oxides consisting of $Al_2O_3$ and $TiO_2$; and wherein said metal oxide acts as a passivation layer.

8. The electrode of claim 7 wherein said top electrode remains conductive following high temperature annealing in a hydrogen atmosphere.

* * * * *